United States Patent [19]

Gillis

[11] Patent Number: 4,734,158

[45] Date of Patent: Mar. 29, 1988

[54] MOLECULAR BEAM ETCHING SYSTEM AND METHOD

[75] Inventor: Harry P. Gillis, Santa Monica, Calif.

[73] Assignee: Hughes Aircraft Company, Los Angeles, Calif.

[21] Appl. No.: 26,072

[22] Filed: Mar. 16, 1987

[51] Int. Cl.$^4$ .................. H01L 21/306; B44C 1/22; C03C 15/00; C03C 25/06

[52] U.S. Cl. .................. 156/643; 156/345; 156/646; 156/653; 156/657; 156/662; 204/192.37; 204/298

[58] Field of Search ............... 156/345, 643, 646, 653, 156/657, 662, 656; 204/192.32, 192.37, 298; 427/38; 219/121 LH, 121 LJ, 121 LM; 437/233, 235, 238, 239, 243

[56] References Cited

U.S. PATENT DOCUMENTS

| | | | |
|---|---|---|---|
| 4,208,240 | 6/1980 | Latos | 156/627 |
| 4,411,733 | 10/1983 | Macklin et al. | 156/643 |
| 4,457,803 | 7/1984 | Takigawa | 156/626 |
| 4,529,475 | 7/1985 | Okano et al. | 156/643 |
| 4,563,367 | 1/1986 | Sherman | 427/39 |
| 4,579,623 | 4/1986 | Suzuki et al. | 156/626 |
| 4,599,135 | 7/1986 | Tsunekawa et al. | 156/643 |
| 4,620,898 | 11/1986 | Banks et al. | 156/643 |
| 4,639,301 | 1/1987 | Doherty et al. | 204/192.31 |

FOREIGN PATENT DOCUMENTS

57-76841 5/1982 Japan .
59-42748 10/1984 Japan .
0120525 6/1985 Japan .

OTHER PUBLICATIONS

Revell, et al., "Reactive Ion Beam Etching", J. Vac. Sci. Technol., vol. 19 No. 4, Nov./Dec. 1981, pp. 1398–1402.

Geis et al., "A Novel Etching Technique", J. Vac. Sci. Technol., 19(4) Nov./Dec. 1981, pp. 1390–1393.

Coburn et al., "Ion-and Electron-Assisted Gas-Surface Chemistry—An Important Effect in Plasma Etching", J. Appl. Phys., vol. 50, No. 5, May 1979, pp. 3189–3196.

Tu et al., "Chemical Sputtering of Fluorinated Silicon", Physical Review B vol. 23, No. 2, Jan. 15, 1981, pp. 823–835.

Mogab et al., "Anisotropic Plasma Etching of Polysilicon", J. Vac. Sci. Technol., 17(3), May/Jun. 1980, pp. 721–730.

Downey et al., "Introduction to Reactive Ion Beam Etching", Solid State Technology Feb. 1981, pp. 121–127.

Brown et al., "Reactive Ion Beam Etching of SiO$_2$ and Polycrystalline Silicon", Appl. Phys. Lett., 37(2) Jul. 15, 1980, pp. 159–161.

Harper et al., "Low Energy Ion Beam Etching", J. Etectrochem. Soc.: Solid-State Science & Technology, vol. 128, No. 5, May 1981, pp. 1077–1083.

Valentini et al., "Supersonic Atomic & Molecular Halogen Nozzle Beam Source", Rev. Sci. Instrum., vol. 48, No. Jan. 1977, pp. 58–63.

Sibener et al., "Development of a Supersonic O($^3P_j$), O($^1D_2$) Atomic Oxygen Nozzle Beam Source", Rev. Sci. Instrum. 51(2), Feb. 1980, pp. 167–182.

Gorry et al., "Microwave Discharge Source for the Production of Supersonic Atom & Free Radical Beams", The Institute of Physics, 1979, pp. 857–860.

Kaufman, "Technology & Applications of Broad-Beam Ion Sources Used in Sputtering, Part 1.Ion Source Technology, J. Vac. Sci. Technol., 21(3), Sep./Oct. 1982, pp. 725–736.

Barker et al., "Surface Composition and Etching of III-V Semiconductor in Cl$_2$ Ion Beams", Appl. Phys. Lett. 40(7) Apr. 1, 1982, pp. 583–586.

Primary Examiner—William A. Powell
Attorney, Agent, or Firm—Wanda K. Denson-Low; Karambelas A. W.

[57] ABSTRACT

A particle beam etching system and method are disclosed in which ion and substantially ion-free chemical radical beams are generated separately and directed onto the same portion of a semiconductor wafer to be etched, preferably perpendicular to the wafer. The beam diameters are substantially smaller than the etching area, and the wafer is moved in an x,y plane to expose the entire etching area to the beams. The redical beam is preferably supersonic, with a flux in the approximate range of $10^{19}$–$10^{21}$ particles per steradian per second, while the ion beam preferably has a density of approximately $10^{14}$ ions per cm.2 per second. The progress of the etching and the location of etching end points are continuously monitored and used to control the etching rate and wafer movement, yielding etching that is both anisotropic and selective, with an accurate and uniform etch depth.

26 Claims, 3 Drawing Figures

MOLECULAR BEAM ETCHING SYSTEM AND METHOD

BACKGROUND OF THE INVENTION

1. Field of the Invention

This invention relates to the fabrication of integrated circuits by molecular beam etching.

2. Description of the Related Art

Integrated circuits are commonly fabricated by building up successive layers of materials on a silicon substrate. In the so-called "patterning" step, a resist pattern is established on a layer and those portions of the layer not coated with the resist are etched away, leaving the etched areas open for the deposition of additional materials. A cross-section of a portion of a typical semiconductor wafer at an intermediate stage of fabrication is illustrated in FIG. 1. A relatively thick bulk silicon substrate 2 is coated with a thin insulating layer 4 of silicon dioxide ($SiO_2$), typically about 1,000 Angstroms (0.1 micron) thick. Layer 4 is covered with a polysilicon layer 6, which is typically in the order of 1 micron thick. A resist pattern 8 is then formed on the polysilicon layer, leaving gaps 10 in the resist layer through which the underlying polysilicon can be etched away.

In general, either liquid or gaseous etchants are used to remove the polysilicon underlying the gaps in the resist, each approach having its particular advantages and disadvantages. Since the present invention involves a gaseous or dry etching system, the discussion will focus primarily on this type of etching.

Assume that the polysilicon area 12, shown in cross-hatched lining in an opening through the resist layer, is to be etched away. Ideally, the etching process should satisfy at least the following three criteria:

(1) The etching should exhibit anisotropy. This means that the side walls of the etched area should be essentially vertical, as indicated by walls 14. Undercutting of the resist layers, as indicated by dashed line 16, should be avoided.

(2) The etching should exhibit selectivity. This means the etching process should extend to, but not go beyond, the interface between the polysilicon layer 6 and the thin $SiO_2$ layer 4. The etching should not extend appreciably into the $SiO_2$ layer, an undesirable situation indicated by dashed line 18.

(3) The etch rate should be reasonably fast to achieve a high throughput of wafers and a correspondingly efficient production rate.

With liquid etching, anisotropy normally cannot be achieved except for one limited crystal lattice structure. With gas etching, which is performed in a vacuum chamber, there is normally a trade-off between anisotropy and selectivity, and the etch rates are not particularly fast.

At present, anisotropic etching is accomplished either in plasma reactors operating in the reactive ion etching (RIE) mode, or in ion milling machines with reactive gases to give reactive ion beam etching (RIBE). Each of these methods has been found to produce specific etch rates below about 3,000 Angstroms per minute. With RIE the surface to be treated is immersed in a plasma consisting of chemically reactive radicals and ions from a parent gas. The relative amounts of ions and radicals cannot be independently controlled in a plasma reactor, resulting in an etching process which requires compromises. To achieve anisotropy, it is necessary to operate at low pressure with a low concentration of reactive species, further reducing the etch rate. The RIE technique is described in an article by C. J. Mogab and H. J. Levenstein, J. Vac. Sci. Technol. 17, page 721 (1980).

Reactive ion beam etching (RIBE) is also relatively slow because the current density of ions (at most 1 $mA/cm.^2$ at energies below 1000 eV) is too low at energies low enough to avoid radiation damage. With RIBE a plasma formed from ions and chemical radicals is directed at the surface to be treated. The addition of a beam of reactive molecules such as $Cl_2$ or $NF_3$ can increase the etch rate, but bleeding reactive gases into the RIBE system raises the background pressure and scatters the ion beam unless the reactive species is supplied as a well-formed molecular beam. To accommodate both beams, the ion beam has typically been directed at the wafer along an axis perpendicular to the wafer surface, while the reactive beam has been applied at an angle to the wafer surface. The angular reactive beam, however, creates a "shadow" along the wafer surface at the edge of each resist layer, causing the polysilicon layer to be under-etched in the shadow region but undercutting the resist in the region opposite the shadow. While conceptually the ion and reactive beams might be manipulated so that both are directed perpendicular to the wafer, as a practical matter the neutral reactive beam is not subject to deflection by electromagnetic fields, and it is very difficult to successfully steer the wide area ion beams (2.5–15 cm. diameter) used in RIBE. The RIBE technique is described in the following articles: D. F. Downey, W. R. Bottoms and P. R. Hanley, Solid State Technol., February 1981, page 121; Y. Horiike and M. Shibagaki, Jpn. J. Appl. Phys. 18, page 2309 (1979); D. M. Brown, B. A. Heath, T. Coutumas and G. R. Thompson, Appl. Phys. Lett. 15, page 159 (1980); J. M. E. Harper, J. J. Cuomo, P. A. Leary, G. M. Summa, H. R. Kaufman and F. J. Bresnoch, J. Electrochem. Soc. 128, page 1077 (1981).

Another problem associated with both RIE and RIBE is that, because the entire wafer is flooded with the molecular particles, the detection of the "end point" (e.g., the polysilicon-$SiO_2$ interface in the example given above) is ambiguous. Wafer yield can be significantly reduced because of either over or under etching.

SUMMARY OF THE INVENTION

In view of the above problems associated with the prior art, the goal of the present invention is the provision of a novel system and method for molecular beam etching that is capable of achieving high quality anisotropy and selectivity simultaneously.

Another purpose is the provision of such a system and method with a relatively high etching rate and production yields.

In the accomplishment of these and other advantages of the invention, narrow ion and chemical radical beams are directed onto the semiconductor substrate to accomplish the etching. The radical beam is generated separately from the ion beam, and is substantially ion-free. The two beams are merged so that they substantially overlap at the substrate, with the radical beam directed along a substantially straight line axis perpendicular to the substrate surface, and the ion beam initially generated at an angle to the substrate surface but deflected so that it strikes the substrate generally coaxially with the radical beam. Precise control of the etching process is achieved by separately controlling the density of ions and radicals directed towards the surface.

Performance is significantly improved by generating the radical beam with a supersonic expansion, the intensity of the beam being within the approximate range of $10^{19}$–$10^{21}$ particles per steradian per second. The ion beam preferably has a density of approximately $10^{14}$ ions per cm.$^2$ per second.

The beams have cross-sectional areas substantially smaller than the substrate area, preferably with diameters in the approximate range of 3–20 mm. The substrate is moved relative to the incident beam so that the beams traverse a desired area on the substrate. Substrate etching is monitored in real time, and the substrate movement and beam intensities are individually controlled in response to the etch monitoring. A more uniform etching and limitation of the beams to the proper etching field is thereby achieved.

Further objects and features of the invention will be apparent to those skilled in the art from the following detailed description of preferred embodiments, taken together with the accompanying drawings, in which:

DETAILED DESCRIPTION OF PREFERRED EMBODIMENTS

The molecular beam etching system and method of the present invention are capable of producing anisotropic and selective etch patterns in substrates such as silicon, polysilicon, $SiO_2$, $Si_3N_4$ and refractory metals necessary for dimensional control of submicron features in microICs. The patterns are produced on single wafers with a throughput and yield commensurate with that attained by prior methods, but with higher quality. The invention makes possible a substantial reduction in the cost of fabricating very large scale integrated (VLSI)-type microcircuits.

Figure 1:
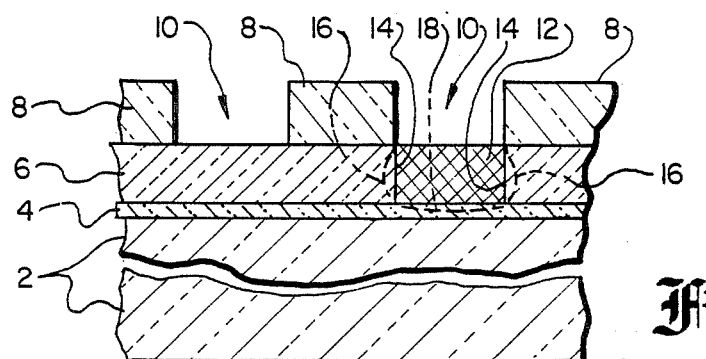
FIG. 1 is a sectional view, not to scale, of a portion of a semiconductor wafer at an intermediate stage of IC fabrication.
Figure 2:
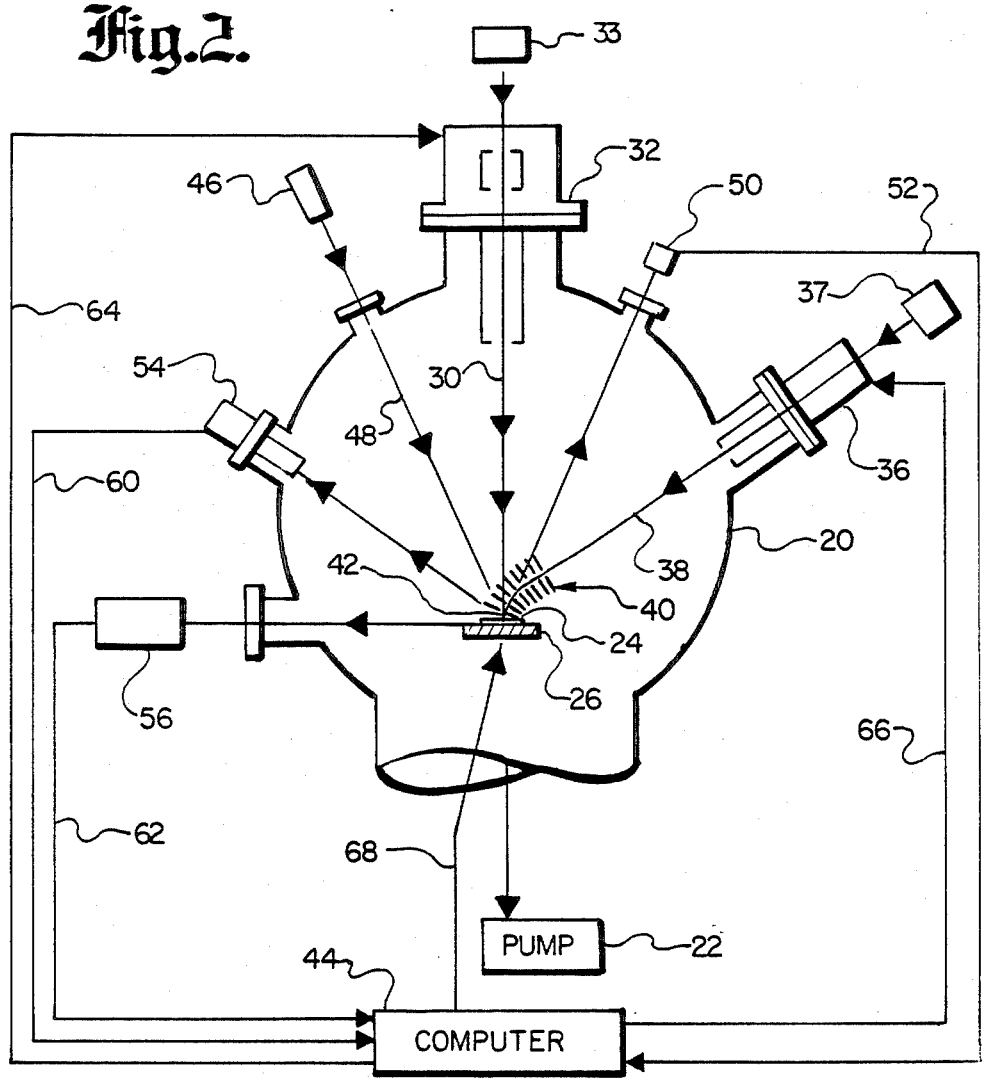
FIG. 2 is a simplified sectional view of a molecular beam etching system employing the present invention, with several principal components of the system indicated in block diagram fashion.

A simplified illustration of a system constructed in accordance with the invention is provided in FIG. 2. Etching takes place within a vacuum chamber 20, which is preferably formed from stainless steel 304 and equipped with sealing surfaces and vacuum components which are resistant to corrosive gases. A pumping station 22 maintains the background pressure within the chamber at a level below $5 \times 10^{-6}$ Torr during wafer processing. A semiconductor wafer 24 is carried on a moveable stage 26, which can be translated in an x,y plane by means of an associated stepping motor or similar drive system.

Two separate beams are superimposed and directed onto the wafer along a coincident axis for etching purposes. In accordance with the invention, the combined action of the two beams produces an etching effect that is substantially anisotropic and selective, and is characterized by a high specific etch rate. The first beam 30 is formed substantially exclusively from chemical radicals, with no ions present. It is generated by a radical beam generator 32, which may operate by known RF, microwave, or thermal dissociation of the parent molecules from a gas supply 33 to produce the radical particles. Laser techniques are also being explored as a radical beam source.

A chemical radical is a fragment of a reactive molecule, and is much more chemically active than the parent molecule. Examples of radicals that may be used with the invention are Cl, Fl and $CF_3$, which are derived respectively from $Cl_2$, $Fl_2$ and $CF_4$. The etch rate is increased if the chemical radical beam 30 is generated with an intensity (flux) in the approximate range of $10^{19}$–$10^{21}$ particles per steradian per second, which requires a supersonic beam, but sub-sonic radical beams can also produce useful but slower results. The radical beam generator is oriented such that the beam is directed substantially normal to the plane of wafer 24.

An ion beam generator 36 is offset to the side of radical beam generator 32 and produces an ion beam 38 which preferably has a density in the order of $10^{14}$ ions per cm.$^2$ per second. The ions can be obtained from any suitable inert gas, such as neon, xenon or argon, housed in a gas supply 37. The ion beam is initially directed by the extraction apparatus of beam generator 36 at a non-right angle to the etching surface of wafer 24, towards the radical beam 30. A series of electromagnetic deflectors 40 deflect and steer the ion beam until it substantially overlaps and merges with the radical beam 30 as a combined beam 42. The ion portion of this combined beam produces a high degree of anisotropy, while the chemical radical portion results in a high specific etch rate.

The interplay between ion and substantially pure (ion-free) radical beams to provide an improved etching process is a basic aspect of the invention. Examples of sources of substantially ion-free supersonic radical beams are provided in the following references: (a) production of radical beams by thermal dissociation—Valentini, Caggiola and Lee, Review of Scientific Instruments 48, 58 (1977); (b) production of radical beams by rf dissociation—Sibener, Buss, Ng and Lee, Review of Scientific Instruments 51, 167 (1980); (c) production of radical beams by MW dissociation—Gorry and Grice, Journal of Physics, E12, 857 (1979). The use of a separate radical beam is to be distinguished from prior etching methods employing a plasma, which combine both ions and reactive molecules in the plasma. The prior art plasma approach is exemplified by Kaufman, Cuomo and Harper, Journal of Vacuum Science and Technology 21, 725 (1982) and Barker, Mayer and Burton, Applied Physics Letters 40, 583 (1982). Although the power and amount of gas can be controlled with a plasma, the detailed fragmentation of the molecules into ions, radicals and reactive molecules cannot be precisely predicted. Thus, there is an uncertainty as to the relative densities of radicals and ions, and often as to the identities of the particles themselves. Since the exact composition of a particular plasma controls its etching characteristics, there is a corresponding unpredictability in the etching that will be achieved. The use of separately generated and controlled ion and radical beams in accordance with the present invention, by contrast, allows for a precision control over the relative densities of ions and radicals at the etching surface.

While the system illustrated in FIG. 2 is preferred for merging the radical and ion beams together so that the beams are coaxial and normal to the surface of the wafer to be etched, other approaches might accomplish the same result. For example, a ring of discrete radical beam sources could be arranged in a circumference around an ion beam generator, with the radical beams directed in a fashion such that they are slightly convergent onto the ion beam and essentially merge with the ion beam at the wafer surface. Similarly, a ring of ion beam sources could be disposed around a chemical radical beam generator. A new type of dual beam source might also be envisioned for generating both a radical and an ion beam along the same axis.

Regardless of the beam generation scheme used, both the radical and ion beams in the preferred embodiment are substantially coaxial and normal to the wafer surface by the time they reach the wafer to avoid the shadowing effect encountered in the prior art, and to produce a more uniform etching.

Conventional prior art ion beam etching techniques use wide beams, typically in the range of 2.5-15 cm. diameter, to flood the entire wafer and simultaneously etch all portions of the wafer that are not coated with resist. With such an approach the limits of the desired etching process, at which the polysilicon layer terminates, are not accurately detected. This ambiguity in end point detection can result in a reduced wafer yield because of either over- or under-etching. In accordance with the present invention, much smaller beams are used and the beams are scanned over the wafer surface to accomplish the desired etching. This yields a much greater degree of control over the etching process and enables detection of the end point within the area being etched. Since the radical beam is composed of neutral particles which are not subject to electromagnetic scanning techniques, scanning is accomplished by holding the beams steady and moving the wafer.

The beam diameters are preferably in the approximate range of 3-20 mm. diameter, and typically may be about 1.0 cm. Although the beam diameters are considerably smaller than the flood beams used in the prior art the specific etch rate is considerably greater, in the order of about 10 microns per minute for a 1.0 cm. diameter beam as opposed to less than 0.3 microns per minute for a prior art 10 cm. diameter beam. Accordingly, total production times can be expected to be at least comparable to those realized in prior art.

Referring back to FIG. 2, stage 26 is translated in the x,y plane under the direction of a computer 44 such that the radical and ion beams traverse the entire desired areas of wafer 24. While a system could be devised to move the wafer stage such that the beams impact only the portions of the wafer that are not coated with resist, and thus increase production rates by irradiating less than the entire surface of each wafer, a stage movement which brings the entire wafer surface under the beams, both coated and uncoated portions, is considerably simpler and more desirable at present.

A number of different monitoring devices are provided to monitor the progress of the etching and to control the stage movement. A helium-neon laser 46 directs a laser beam 48 onto the same portion of the wafer as the ion and radical beams. The reflected laser beam is received by detector 50, which measures the specific etch rate. Some of the laser light is reflected directly off the upper surface of the polysilicon layer, while another portion of the light penetrates to the interface between the polysilicon and $SiO_2$ layers. The interference pattern produced by these two reflected portions of the beam is used in the laser detector 50 and associated processing apparatus to determine the depth of the portion of the polysilicon layer that is currently being etched. Since the termination of the polysilicon layer defined the desired end point of the etch, the laser interferometry system also provides an accurate indication of when an end point has been reached. This information is provided to the computer over line 52.

A mass spectrometer 54 is also provided to chemically identify the volatile products currently being removed from the wafer by the etching process. End points are detected by changes in the chemical species removed from the wafer. An optical spectrometer 56 chemically identifies of the volatile products removed from the wafer. The information obtained from the mass spectrometry and optical spectroscopy systems is provided to the computer over lines 60 and 62, respectively. In response to its various inputs, the computer provides control signals over lines 64 and 66 to the radical and ion beam generators to control the etch rate, and over line 68 to the stage drive system to control the stage movement.

Figure 3:
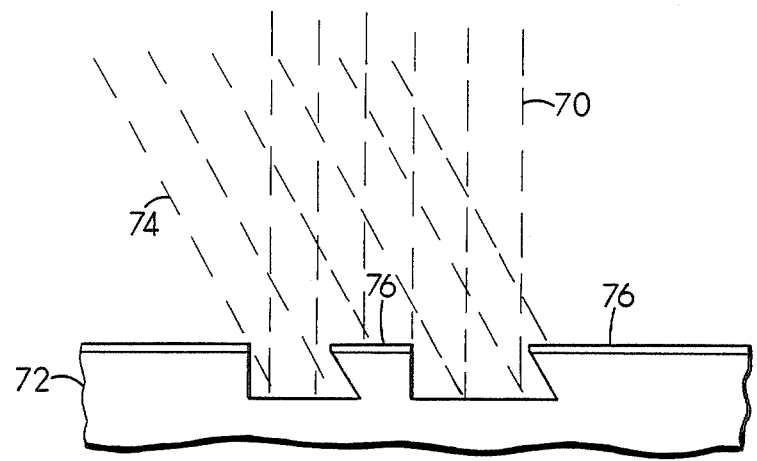
FIG. 3 is a sectional view of a portion of a semiconductor wafer at which separate ion and radical beams are directed at an angle to each other.

In certain circumstances it may be desirable to direct the radical and ion beams onto the substrate at a substantial angle to each other to obtain shadowing effects. This is illustrated in FIG. 3, in which an ion beam 70 is perpendicular to the substrate 72 while the radical beam 74 is at a smaller angle. The etching effect under mask segments 76 will exhibit a shadow determined by the beam angularity. The respective angles of the two beams could also be reversed, or both beams could be directed at a non-right angle to the substrate. This is somewhat similar to the shadow etching disclosed in Geis, Lincoln, Efremow and Piacentini, "A Novel Anisotropic Dry Etching Technique", Journal of Vacuum Science Technology, 19(4), November, December 1981. In Geis, et al., however, a reactive rather than a chemical beam is used, with problems of unpredictable content similar to those encountered with plasma etching.

The disclosed system and method produce highly anisotropic and selective etching with a greater degree of control over the total etching depth, uniformity of etching, and determination of etching end points than previously available. Since numerous variations and alternate embodiments will occur to those skilled in the art, it is intended that the invention be limited only in terms of the appended claims.

I claim:

1. A particle beam etching system, comprising:
   means for supporting a target substrate to be etched,
   means for generating an ion beam with a predetermined ion density,
   means for generating a chemical radical beam with a predetermined radical particle density, and
   means for directing the radical and ion beams onto a common location on a substrate in an etching operation.

2. The etching system of claim 1, the ion and radical beam directing means directing said beams onto the substrate approximately normal to the substrate.

3. The etching system of claim 2, the beam directing means comprising means for directing the radical beam onto the substrate along a substantially straight line axis, and means for initially directing the ion beam at a non-right angle to the etching surface and then deflecting the ion beam generally coaxially with the radical beam.

4. The etching system of claim 1, wherein the radical beam generating means is adapted to generate the radical beam with a flux in the approximate range of $10^{19}$–$10^{21}$ particles per steradian per second.

5. The etching system of claim 4, wherein the radical beam generating means is adapted to generate the radical beam as a supersonic radical beam.

6. The etching system of claim 5, wherein the ion beam generating means is adapted to generate the ion beam with a density of approximately $10^{14}$ ions per cm.$^2$ per second.

7. The etching system of claim 5, wherein the ion and radical beams are generated with diameters at the substrate in the approximate range of 3–20 mm.

8. The etching system of claim 1, wherein the ion and radical beam generating means are adapted to generate their respective beams with cross-sectional areas at the substrate substantially smaller than the substrate area, and further comprising means for moving the substrate relative to the beams so that the beams traverse a desired portion of the substrate.

9. The etching system of claim 1, wherein the radical beam generating means is adapted to generate the radical beam as a supersonic radical beam.

10. A particle beam etching system, comprising:
means for supporting a target substrate to be etched,
means for generating an ion beam with a predetermined ion density,
means independent of the ion beam generating means for generating a chemical radical beam which is substantially free of ions, and
means for directing the radical and ion beams onto a common location on a substrate in an etching process.

11. The etching system of claim 10, the radical beam generating means comprising means for initially generating the radical beam substantially free of ions.

12. The etching system of claim 11, the radical beam generating means comprising a thermal type generator.

13. The etching system of claim 10, the radical beam generating means comprising means for initially generating a mixed ion and radical beam, and electrostatic deflection means for removing the ions from the beam.

14. The etching system of claim 13, the means for initially generating a mixed ion and radical beam comprising a radio frequency type generator.

15. The etching system of claim 13, the means for initially generating a mixed ion and radical beam comprising a microwave type generator.

16. A method of etching a semiconductor substrate, comprising the steps of:
generating and directing an ion beam onto a portion of the substrate to be etched, and
generating and directing a substantially ion-free chemical radical beam onto substantially the same portion of the substrate.

17. The method of claim 16, wherein the ion and radical beams are directed onto the substrate generally coaxially.

18. The method of claim 17, wherein the ion and radical beams are directed onto the substrate at approximately right angles to the substrate.

19. The method of claim 18, wherein the radical beam is directed along a generally straight line axis onto the substrate, and the ion beam is initially directed at a non-right angle to the substrate but is deflected into generally coaxial alignment with the radical beam.

20. The method of claim 16, wherein the ion and radical beams are directed onto the substrate at a substantial angle to each other.

21. The method of claim 16, wherein the radical beam has a flux in the approximate range of $10^{19}$–$10^{21}$ particles per steradian per second.

22. The method of claim 21, wherein the ion beam has a density of approximately $10^{14}$ ions per cm.$^2$ per second.

23. The method of claim 16, wherein the ion and radical beams have cross-sectional areas at the substrate substantially less than the substrate area, and further comprising the step of moving the substrate relative to the beams so that the beams traverse a desired portion of the substrate.

24. The method of claim 23, further comprising the steps of monitoring the progress of the substrate etching, and controlling the substrate movement and the beam intensities in response thereto.

25. The method of claim 24, wherein the ion and radical beams are generated with diameters at the substrate in the approximate range of 3–20 mm.

26. The method of claim 16, wherein the radical beam is generated as a supersonic beam.

* * * * *

UNITED STATES PATENT AND TRADEMARK OFFICE
CERTIFICATE OF CORRECTION

PATENT NO. : 4,734,158
DATED : March 29, 1988
INVENTOR(S) : Harry P. Gillis

It is certified that error appears in the above—identified patent and that said Letters Patent is hereby corrected as shown below: On The Title Page:

Page 1, Section [57], in the Abstract, line 9, delete "redical" and insert instead --radical--.

Signed and Sealed this

Eighteenth Day of October, 1988

Attest:

DONALD J. QUIGG

Attesting Officer      Commissioner of Patents and Trademarks